(12) United States Patent
Walker

(10) Patent No.: US 8,737,027 B1
(45) Date of Patent: May 27, 2014

(54) ESD PROTECTION DEVICE WITH CHARGE COLLECTIONS REGIONS

(75) Inventor: Andrew J. Walker, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 262 days.

(21) Appl. No.: 12/135,335

(22) Filed: Jun. 9, 2008

Related U.S. Application Data

(60) Provisional application No. 60/952,387, filed on Jul. 27, 2007.

(51) Int. Cl.
*H02H 9/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 4,990,802 A | 2/1991 | Smooha | |
| 5,019,888 A | 5/1991 | Scott et al. | |
| 5,043,782 A | 8/1991 | Avery | |
| 5,140,401 A | 8/1992 | Ker et al. | |
| 5,157,573 A | 10/1992 | Lee et al. | |
| 5,173,755 A | 12/1992 | Co | |
| 5,182,220 A | 1/1993 | Ker et al. | |
| 5,218,222 A | 6/1993 | Roberts | |
| 5,237,395 A | 8/1993 | Lee | |
| 5,264,723 A | 11/1993 | Strauss | |
| 5,289,334 A | 2/1994 | Ker et al. | |
| 5,329,143 A | 7/1994 | Chan et al. | |
| 5,444,400 A | 8/1995 | Hall | |
| 5,455,436 A | 10/1995 | Cheng | |
| 5,576,557 A | 11/1996 | Ker et al. | |
| 5,591,992 A | 1/1997 | Leach | |
| 5,602,404 A | 2/1997 | Chen | |
| 5,625,522 A | 4/1997 | Watt | |
| 5,640,299 A | 6/1997 | Leach | |

(Continued)

FOREIGN PATENT DOCUMENTS

JP 2003318265 A * 11/2003

OTHER PUBLICATIONS

Lee et al., "Novel ESD Protection Structure with Embedded SCR LDMOS for Smart Power Technology," International Reliability Physics Symposium, 2002, pp. 156-161.

(Continued)

*Primary Examiner* — Rexford Barnie
*Assistant Examiner* — Ann Hoang

(57) ABSTRACT

A device for providing electrostatic discharge (ESD) protection is described which includes a silicon controlled rectifier (SCR), a mechanism for triggering the SCR, and a pair of contact regions of opposing conductivity type distinct from regions of the SCR that are interposed between the cathodic and anodic regions of the SCR. The contact regions are configured to collect charge generated by the SCR. In some embodiments, the device may include a transistor and the cathodic region of the SCR may dually serve as a source contact region of the transistor. A circuit is described which includes an ESD protection device coupled between high and low voltage power supply bus bars, wherein the ESD protection device includes an SCR as well as a pair of contact regions of opposing conductivity type distinct from the SCR and interposed between the cathodic and anodic regions of the SCR.

14 Claims, 2 Drawing Sheets

(56) References Cited

U.S. PATENT DOCUMENTS

| | | | |
|---|---|---|---|
| 5,670,799 A | 9/1997 | Croft | |
| 5,671,111 A * | 9/1997 | Chen | 361/56 |
| 5,675,469 A | 10/1997 | Racino et al. | |
| 5,682,047 A | 10/1997 | Consiglio et al. | |
| 5,719,733 A | 2/1998 | Wei et al. | |
| 5,754,380 A | 5/1998 | Ker et al. | |
| 5,784,242 A | 7/1998 | Watt | |
| 5,825,600 A | 10/1998 | Watt | |
| 6,016,002 A | 1/2000 | Chen et al. | |
| 6,066,879 A | 5/2000 | Lee et al. | |
| 6,169,309 B1 | 1/2001 | Teggatz et al. | |
| 6,281,527 B1 | 8/2001 | Chen | |
| 6,323,523 B1 | 11/2001 | Lee et al. | |
| 6,365,940 B1 | 4/2002 | Duvvury et al. | |
| 6,414,360 B1 | 7/2002 | Gardner | |
| 6,433,368 B1 | 8/2002 | Vashchenko et al. | |
| 6,459,127 B1 | 10/2002 | Lee et al. | |
| 6,523,266 B2 | 2/2003 | Yang | |
| 6,548,874 B1 | 4/2003 | Morton et al. | |
| 6,576,934 B2 | 6/2003 | Cheng et al. | |
| 6,580,184 B2 | 6/2003 | Song | |
| 6,642,088 B1 | 11/2003 | Yu | |
| 6,645,802 B1 * | 11/2003 | Li et al. | 438/237 |
| 6,671,153 B1 * | 12/2003 | Ker et al. | 361/111 |
| 6,696,708 B2 | 2/2004 | Hou et al. | |
| 6,882,214 B2 | 4/2005 | Spenea et al. | |
| 6,894,351 B2 * | 5/2005 | Okawa et al. | 257/347 |
| 6,900,091 B2 | 5/2005 | Williams et al. | |
| 6,919,603 B2 | 7/2005 | Brodsky et al. | |
| 6,924,531 B2 | 8/2005 | Chen et al. | |
| 7,061,051 B2 | 6/2006 | Yu | |
| 7,202,114 B2 | 4/2007 | Salcedo et al. | |
| 7,205,630 B2 | 4/2007 | Chang et al. | |
| 7,271,629 B2 | 9/2007 | Jeon et al. | |
| 7,375,398 B2 | 5/2008 | Wang et al. | |
| 7,385,253 B2 | 6/2008 | Kim | |
| 7,659,558 B1 | 2/2010 | Walker et al. | |
| 2004/0004231 A1 | 1/2004 | Peng et al. | |
| 2004/0027744 A1 * | 2/2004 | Liu et al. | 361/56 |
| 2004/0136127 A1 * | 7/2004 | Kodama et al. | 361/56 |
| 2005/0254189 A1 | 11/2005 | Wu et al. | |
| 2006/0262471 A1 * | 11/2006 | Van Camp | 361/56 |
| 2006/0274465 A1 | 12/2006 | Wu et al. | |
| 2007/0008667 A1 * | 1/2007 | Steinhoff | 361/56 |
| 2007/0069310 A1 | 3/2007 | Song et al. | |
| 2007/0114565 A1 | 5/2007 | Makaram | |
| 2007/0262386 A1 * | 11/2007 | Gossner et al. | 257/355 |
| 2008/0012044 A1 * | 1/2008 | Salcedo et al. | 257/173 |
| 2008/0253046 A1 * | 10/2008 | Lou et al. | 361/56 |

OTHER PUBLICATIONS

Duvvury et al., "Device Integration for ESD Robustness of High Voltage Power MOSFETs," IEDM 1994, pp. 16.4.1-16.4.4.

Concannon et al., "A Device Level Negative Feedback in the Emitter Line of SCR-Structures as a Method to Realize Latch-Up Free ESD Protection," Reliability Physics Symposium Proceedings, 2003, pp. 105-111.

U.S. Appl. No. 11/233,959 entitled "Silicon Controlled Rectifier Electrostatic Discharge Clamp for a High Voltage Laterally Diffused MOS Transistor," filed Sep. 23, 2005.

U.S. Appl. No. 11/234,255 entitled "Circuits Providing ESD Protection to High Voltage Laterally Diffused Metal Oxide Semiconductor (LDMOS) Transistors," filed Sep. 23, 2005.

U.S. Appl. No. 11/954,514 entitled "Apparatus and Method that Utilizes a Programmable Holding Voltage for Protecting an Integrated Circuit Against Electrostatic Discharge," filed Dec. 12, 2007.

USPTO Final Rejection for U.S. Appl. No. 11/234,255 dated Apr. 23, 2009; 14 pages.

USPTO Final Rejection for U.S Appl. No. 11/234,255 dated Jan. 8, 2009; 10 pages.

USPTO Requirement for Restriction/Election for U.S. Appl. No. 11/234,255 dated Sep. 3, 2008; 7 pages.

USPTO Non-Final Rejection for U.S. Appl. No. 11/234,255 dated Mar. 4, 2008; 10 pages.

USPTO Non-Final Rejection for U.S. Appl. No. 11/234,255 dated Aug. 27, 2007; 12 pages.

USPTO Requirement for Restriction/Election for U.S. Appl. No. 11/234,255 dated Jul. 5, 2007; 6 pages.

USPTO Notice of Allowance for U.S. Appl. No. 11/233,959 dated Sep. 30, 2009; 7 pages.

USPTO Notice of Allowance for U.S. Appl. No. 11/233,959 dated Jun. 3, 2009; 7 pages.

USPTO Non-Final Rejection for U.S. Appl. No. 11/233,959 dated Nov. 21, 2008; 7 pages.

USPTO Requirement for Restriction/Election for U.S. Appl. No. 11/233,959 dated Jun. 3, 2008; 6 pages.

USPTO Requirement for Restriction/Election for U.S. Appl. No. 11/233,959 dated Apr. 4, 2008; 6 pages.

USPTO Notice of Allowance for U.S. Appl. No. 08/845,302 dated May 19, 1998; 2 pages.

USPTO Non-Final Rejection for U.S. Appl. No. 08/845,302 dated Feb. 6, 1998; 9 pages.

Duvvury et al., "ESD Phenomena and Protection Issues in CMOS Output Buffers," 1987; pp. 174-180; 4 pages.

Duvvury et al., "Internal Chip ESD Phenomena Beyond the Protection Circuit," 1988; pp. 2133-2138; 6 pages.

Polgreen et al., "Improving the ESD Failure Threshold of Silicided nMOS Output Transistors by Ensuring Uniform Current Flow," 1989; pp. 167-174; 8 pages.

Duvvury et al., "Achieving Uniform nMOS Device Power Distribution for Sub-micron ESD Reliability," 1992; 92-131 through 92-134; 4 pages.

Seven H. Voldman "ESD Protection in a Mixed Voltage Interface and Multi-Rail Disconnected Power Grid Environment in 0.50- and 0.25-um Channel Length CMOS Technologies," 1995; 94-125 through 94-134; 10 pages.

Debral et al., "Core Claps for Low Voltage Technologies," 1994; 94-141 through 94-149; 9 pages.

Voldman et al., "Mixed-Voltage Interface ESD Protection Circuits for Advance Microprocessors in Shallow Trench and LOCOS Isolation CMOS Technologies," 1994; 94-277 through 94-280; 4 pages.

Jaffe et al., "Electrostatic Discharge Protection in a 4-MBIT Dram," 1990; pp. 1-6; 6 pages.

LeBlanc et al., "Proximity Effects of 'Unused Output Buffers on ESD Performance," 1991; pp. 327-330; 4 pages.

Worley et al., "Sub-Micron Chip ESD Protection Schemes which Avoid Avalanching Junction," 1995; 95-13 through 95-20; 8 pages.

Chatterjee et al., "A Low-Voltage Triggering SCR for On-Chip ESD Protection at Output and Input Pads," 1991; pp. 21-22; 2 pages.

USPTO Notice of Allowance for U.S. Appl. No. 08/297,629 dated Oct. 28, 1996; 8 pages.

USPTO Final Rejection for U.S. Appl. No. 08/297,629 dated Jun. 10, 1996; 6 pages.

USPTO Non-Final Rejection for U.S. Appl. No. 08/297,629 dated Sep. 12, 1995; 8 pages.

USPTO Notice of Allowance for U.S. Appl. No. 08/758,336 dated Dec. 4, 1997; 2 pages.

USPTO Non-Final Rejection for U.S. Appl. No. 08/758,336 dated Aug. 13, 1997; 6 pages.

Tandan, "ESD Trigger Circuit," EOS/ESD Symposium 1994, pp. 94-120 through 94-124; 5 pages.

Merrill et al., "ESD Design Methodology," EOS/ESD Symposium 1993, pp. 93-233 through 93-237; 5 pages.

van Roozen daal et al, "Standard ESD Testng of Inegaed Cicuts," 1990 EOS/ESD Symposium Poceedngs, pp. 119-130; 12 pages.

Watt et al., "A Hot-Carrier Trigger SCR for Smart Power Bus ESD Protection," Cypress Semiconductor Corporation, 1995 IEEE Electron Device Letters, vol. 12, No. 1, Jan. 1991, 4 pages.

USPTO Advisory Action for U.S. Appl. No. 11/954,514 dated Aug. 3, 2010; 3 pages.

USPTO Final Rejection for U.S. Appl. No. 11/954,514 dated May 27, 2010; 13 pages.

USPTO Non-Final Rejection for U.S. Appl. No. 11/954,514 dated Nov. 27, 2009; 13 pages.

* cited by examiner

ESD PROTECTION DEVICE WITH CHARGE COLLECTIONS REGIONS

PRIORITY CLAIM

This application claims priority to U.S. Provisional Application No. 60/952,387 filed Jul. 27, 2007, the entire contents of which are herein incorporated by reference.

BACKGROUND OF THE INVENTION

1. Field of the Invention

The present invention relates generally to devices and circuits providing electrostatic discharge (ESD) protection, and more particularly, to devices and circuits providing ESD protection which include silicon controlled rectifiers.

2. Description of the Related Art

The following descriptions and examples are given as background information only.

As is well known in the microelectronics industry, integrated circuit devices are susceptible to damage from applications of excessive voltages, such as, for example, electrostatic discharge (ESD) events. In particular, during an ESD event, charge transferred within a circuit can develop voltages that are large enough to break down insulating films (e.g., gate oxides) on the device and/or dissipate sufficient energy to cause electro-thermal failures in the device. Such electro-thermal failures include contact spiking, silicon melting, and metal interconnect melting. As such, protection circuits are often connected to I/O bonding pads of an integrated circuit to safely dissipate energy associated with ESD events away from active circuitry. Protection circuits may also be connected to power supply pads or between power supply buses to prevent damage to active circuitry.

One approach for providing ESD protection in integrated circuits is to employ a silicon controlled rectifier (SCR) for transferring charge away from active devices of a circuit. Problems, however, arise when an SCR-based ESD protection device is used for power supply protection since holding voltages of SCRs typically used in such devices are lower than operating voltages of the circuits in which they are employed. In particular, due to the relative low holding voltages of SCRs in SCR-based ESD protection devices, an SCR may be triggered and held in the "on" state during normal operation of a circuit and cause catastrophic damage to the circuit. Although the holding voltage of an SCR may be increased by increasing the distance between the cathodic and anodic regions of the SCR, such a solution contradicts the increasing demands in the semiconductor industry to limit and reduce footprint size of circuit devices. As a consequence, there is a trade-off regarding the level of ESD protection offered by SCR-based devices.

Accordingly, it would be beneficial to develop an ESD protection device having a relatively small footprint that allows the holding voltage of an incorporated SCR to be higher than the operating voltage of the circuit in which the device is included.

SUMMARY OF THE INVENTION

The problems outlined above may be in large part addressed by electrostatic discharge (ESD) protection devices and circuits having a pair of charge collection regions interposed between cathodic and anodic regions of a silicon controlled rectifier (SCR) and which are further independent of the SCR. The following are mere exemplary embodiments of ESD devices and a circuit including an ESD device and are not to be construed in any way to limit the subject matter of the claims.

One embodiment of a device for providing ESD protection includes a silicon controlled rectifier (SCR), a mechanism for triggering the SCR, and a pair of contact regions of opposing conductivity type distinct from regions of the SCR that are interposed between the cathodic and anodic regions of the SCR.

Another embodiment of a device for providing ESD protection includes a transistor and an SCR having a cathodic region dually serving as a source contact region of the transistor. The device further includes a pair of collection regions of opposing conductivity type interposed between the cathodic region and an anodic region of the SCR. The collection regions are distinct from regions of the SCR and are configured to collect charge generated by the SCR.

An embodiment of a circuit includes an ESD protection device coupled between high and low voltage power supply bus bars, wherein the ESD protection device comprises a silicon controlled rectifier, a mechanism for triggering the SCR, and a pair of contact regions of opposing conductivity type distinct from the SCR and interposed between the cathodic and anodic regions of the SCR.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
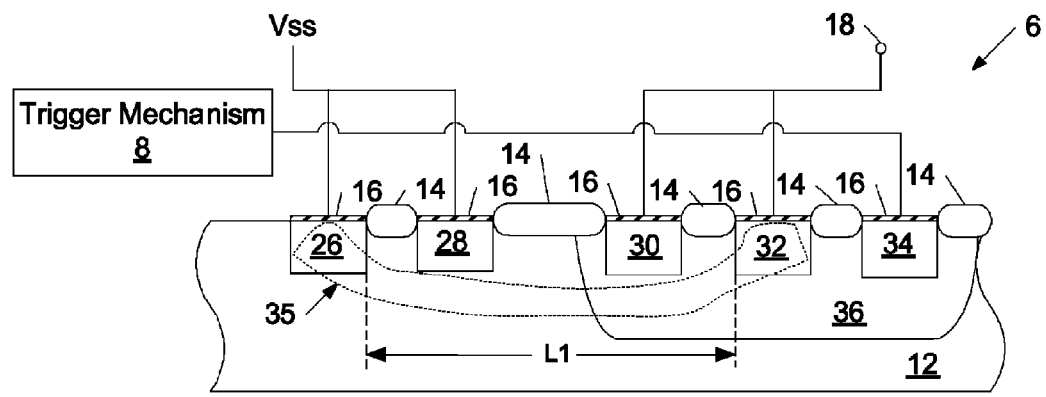
FIG. 1 is an exemplary cross-sectional view of a semiconductor topography configured to provide electrostatic discharge (ESD) protection.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary devices and circuits for providing electrostatic discharge (ESD) are illustrated in FIGS. 1-4. In particular, FIG. 1 illustrates a cross-sectional view of ESD protection device 6 including a trigger circuit and a plurality of contact regions and interconnects which are collectively configured and arranged to form silicon controlled rectifier (SCR) 35. More specifically, such components are collectively configured and arranged to transfer charge from a bus coupled to node 18 to a bus coupled to low power supply Vss. In general, a bus coupled to node 18 may be coupled to active devices of an integrated circuit (i.e., devices distinct from those shown in FIG. 1 and used for operation of an integrated circuit other than for ESD protection). As set forth in more detail below node 18 may be coupled to a bus directly connected to a high voltage signal pad or may be directly coupled to a high voltage power supply. In either case, diverting charge from a bus coupled to node 18 will prevent excessive charge from accessing active devices of the integrated circuit.

It is noted that the components of ESD protection device 6 illustrated in FIGS. 1-4 are not necessarily drawn to scale. In particular, the scale of some layers and/or structures in some of the figures may be greatly exaggerated to emphasize characteristics of the topography. It is further noted that elements shown in more than one figure and that may be similarly configured have been indicated using the same reference numerals. In addition, FIGS. 1-4 illustrate partial cross-sectional views of semiconductor topographies and, thus, the layers depicted in the figures may extend to other regions of the semiconductor topography as indicated by the curved lateral edges of the layers.

As used herein, the term "semiconductor topography" may generally refer to a topography including one or more layers and/or structures used to form a microelectronic device and/or circuit. As such, the term may refer to topographies used at any stage during fabrication of a microelectronic device and/or circuit or may refer to topographies of finished product resulting from such fabrication processes. Consequently, the ESD protection devices depicted in FIGS. 1-4 may not necessarily be coupled to power supplies (i.e., $V_{DD}$ and/or Vss) or signal pads in some embodiments since the illustrated topographies may be representative of a topography during an intermediate stage of fabrication or a topography prior to being coupled to power supplies. Rather, the depiction of Vss and node 18 may in some cases represent the intended connections of the interconnects. In yet other embodiments, FIGS. 1-4 may represent circuits in which the ESD protection devices are coupled to power supplies (i.e., $V_{DD}$ or Vss) and/or signal pads. In either case, the topographies described herein may alternatively be referred to as "microelectronic topographies" and, as such, the term is used interchangeably herein with "semiconductor topographies".

As shown in FIG. 1, the components of ESD protection device 6 are formed within and above semiconductor layer 12. The material of semiconductor layer 12 may include any of those known in the semiconductor fabrication industry. For instance, semiconductor layer 12 may be a monocrystalline silicon or silicon-germanium substrate. Alternatively, semiconductor layer 12 may include an epitaxial layer arranged upon an interlevel dielectric forming a silicon-on-insulator (SOI) base. In either case, semiconductor layer 12 may be a relatively lightly doped (i.e., doped with a relatively light net concentration of electrically active p-type impurities or n-type impurities) and, thus, may have a relatively low degree of conductivity. For example, a doping level of semiconductor layer 12 may be generally less than or equal to approximately $1.0 \times 10^{19}$ cm$^{-3}$, more specifically between approximately $1.0 \times 10^{13}$ cm$^{-3}$ and approximately $1.0 \times 10^{17}$ cm$^{-3}$, and in some embodiments between about $1.0 \times 10^{14}$ cm$^{-3}$ and about $1.0 \times 10^{16}$ cm$^{-3}$. Higher or lower doping levels, however, may be employed depending on the design specifications of ESD protection device 6.

FIG. 1 further illustrates ESD protection device 6 including trigger mechanism 8. In general, the ESD protection devices described herein may be configured with any type of mechanism known in the art for triggering an SCR. In particular, the ESD protection device 6 may include any structure that starts to leak current at voltages higher than the operating voltage of the circuit in which ESD protection device 6 is arranged such that current within well region 36 starts to flow from node 18. Exemplary triggering mechanisms may include but are not limited to an avalanche breakdown of a drain region of a metal-oxide-semiconductor (MOS) transistor, a resistance-capacitance triggered n-channel MOS field effect transistor, and an active MOS mode transistor. It is noted that one skilled in the art would be apprised of the manner to modify the configuration and arrangement of components within a semiconductor topography to incorporate the novel aspects disclosed herein (i.e., incorporating a pair of charge collection regions between cathodic and anodic regions of an SCR which are independent of the SCR) with any trigger mechanism known in the art. As such, although specific construction and operation of ESD protection devices having a triggering mechanism employing a drain avalanche breakdown transistor are described below in reference to FIGS. 2-4, the ESD protection devices contemplated herein are not necessarily so limited.

As shown in FIG. 1, ESD protection device 6 includes well region 36 having contact regions 30, 32, and 34 disposed therein. In addition, ESD protection device 6 includes contact regions 26 and 28 disposed outside of well region 36. Well region 36 and contact regions 26, 30, and 34 are of opposite conductivity type as semiconductor layer 12 and contact regions 28 and 32 are of the same conductivity type as semiconductor layer 12. As used herein, the term "contact region" may generally refer to a diffusion region within a semiconductor substrate at which contact is made to allow current flow. In some embodiments, cladding layer 16 may be formed over such regions, as well as over other contact regions of ESD protection device 10, to improve the electrical conductivity of connections thereto.

In general, well region 36 may have a lighter net concentration of electrically active dopants than contact regions 30 and 34. In particular, an exemplary net doping level range for well region 36 may generally be between approximately $1.0 \times 10^{16}$ and approximately $5.0 \times 10^{18}$ cm$^{-3}$, more specifically between approximately $5.0 \times 10^{16}$ and approximately $1.0 \times 10^{18}$ cm$^{-3}$, and in some embodiments around $2.0 \times 10^{17}$ cm$^{-3}$. In contrast, contact regions 30 and 34 as well as contact regions 28 and 32 may generally include a net dopant concentration level between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^{-3}$, and in some embodiments around $1.0 \times 10^{20}$ cm$^{-3}$. Higher or lower doping levels for well region 36 and contact regions 28, 32, 30, and 34, however, may be used, depending on the design specifications of ESD protection device 6. In some embodiments, well region 36 may alternatively be omitted from ESD protection device 6. In such cases, semiconductor layer 12 may be of the same conductivity type as contact regions 30 and 34 and have a relatively lighter net concentration of dopants. Furthermore, ESD protection device 6 may include a well region of opposite conductivity type encompassing contact regions 26 and 28 in such an embodiment. In either embodiment, a consequence of contact regions 30 and 34 being disposed within a region having a lighter net concentration of electrically active dopants is that the contact regions may collectively and innately function as a resistor, which as described in more detail below may be used to trigger SCR 35.

Due to the arrangement of well region 36 and contact regions 26 and 32 in FIG. 1, a pnpn or npnp junction is formed among contact region 32, well region 36, semiconductor layer 12, and contact region 26. More specifically, a first bipolar transistor (either npn or pnp) is formed by contact region 26 (emitter/collector), semiconductor layer 12 (base), and well region 36 (collector/emitter). In addition, a second bipolar transistor (either pnp or npn) is formed by contact region 32 (emitter/collector), well region 36 (base), and semiconductor layer 12 (collector/emitter). Collectively, the bipolar transistors serve as silicon controlled rectifier (SCR) 35, denoted in FIG. 1 by a looped dotted line. In particular, contact regions 26 and 32 may serve as cathodes and anodes of SCR 35, respectively or vice versa, depending on the conductivity types of the regions formed within ESD protection device 6. It is noted that the looped dotted line in FIG. 1 is used to illustrate the general connection of diffusion regions making up SCR 35 and is not intended to imply a particular boundary of the SCR.

FIG. 1 illustrates ohmic contact regions 30, 32, and 34 may be dielectrically spaced from each other by field oxide isolation structures 14. Similarly, contact regions 26 and 28 may be respectively spaced from contact regions 28 and 30 by field oxide isolation structures 14. Alternative techniques for spacing the contact regions, however, may be used and, thus, some or all of field oxide isolation structures 14 within ESD protection device 6 and any of the other ESD protection devices described herein may be omitted in some embodiments. For instance, a temporary masking layer may be used to prevent dopants from being implanted into such regions of the semiconductor topography. It is noted that although many of the spacings between the contact regions (i.e., field oxide isolation structures 14) shown in FIG. 1 appear to have equal widths, ESD protection device 6 is not necessarily so limited. In particular, each spacing may be independently optimized for the operation of ESD protection device 6 and, therefore, one or more of them may differ in size in some embodiments. In some embodiments, contact regions of ESD protection device 6 may be arranged directly adjacent to each other, such that no spacing exists therebetween. For instance, contact region 28 may border contact region 26. In addition or alternatively, contact region 30 may border contact region 32.

As shown in FIG. 1, contact regions 26 and 28 are coupled to low power supply Vss. In contrast, contact regions 30 and 32 are coupled to node 18, which in turn is coupled to a bus coupled to a high voltage signal pad or a high voltage power supply. In addition, trigger mechanism 8 is coupled to contact region 34. When an integrated circuit including ESD protection device 6 is powered-up, node 18 is essentially between 0 volts and $V_{DD}$ and SCR 35 is initially in a first, high-impedance "OFF" state. In the first state, any voltage that is applied to input pads of the integrated circuit in excess of the high voltage power supply $V_{DD}$ but below the threshold trigger level of trigger mechanism 8, will not cause large leakage currents to be drawn through ESD protection device 6. Rather, such initial voltages will at most cause relatively small, transient currents to flow through active devices of the integrated circuit to charge the bus coupled to node 18 to a voltage level below the excessive voltage being applied. Subsequent applications of voltages higher than $V_{DD}$ will cause substantially no further input leakage currents to flow. Controlled application of voltages, even in excess of $V_{DD}$, to pins of the device in this context may be considered "normal." However, ESD events are not considered part of the "normal" operation of the device.

For a subsequent positive polarity ESD event on a high voltage signal pad or a high voltage power supply with respect to Vss, the voltage on node 18 increases with respect to Vss. When the voltage on the bus coupled to node 18 approaches the trigger voltage of SCR 35, current begins to flow through well region 36 between contact regions 30 and 34 and injects charge from contact region 32 (i.e., holes in embodiments in which contact regions 30 and 34 are n-type and electrons when contact regions 30 and 34 are p-type) into semiconductor layer 12. The charge injection into semiconductor layer 12 forward biases the contact region 26, which in turn injects charges of opposite conductivity type (i.e., electrons in embodiments in which contact region 26 is n-type and holes when contact region 26 is p-type) into well region 36. The current flowing between contact regions 30 and 34 results in a voltage drop across well region 36, causing contact region 32 to become forward biased. Forward bias of contact region 32 results in an injection of charge (i.e., holes in embodiments in which contact region 32 is p-type and electrons when contact region 32 is n-type) into semiconductor layer 12.

The injection of the charge from contact region 32 hastens the transition of SCR 35 into a latched state, referenced as a low-impedance "ON" state of SCR 35. Inasmuch as the injection of charge from contact region 32 is initiated, the time lag between the occurrence of an ESD event and when SCR 35 turns on becomes sufficiently short to effectively handle relatively fast ESD events, such as ESD events occurring according to the Charged Device Model (CDM), for example. A similar operation of ESD protection device 6 may be employed for negative polarity ESD events on a signal pad or a power supply with respect to $V_{DD}$, when the protection device is employed as a core clamp between high and low voltage power supplies of the integrated circuit. In either application, SCR 35 will remain in the low-impedance state until current through either the bipolar transistors is interrupted. This interruption may occur when all of the charge from the ESD event is transferred from node 18 to Vss. Once the charge transfer is complete, SCR 35 returns to a high-impedance "OFF" state.

In general the distances between ohmic contact regions 30, 32, and 34 influence the trigger voltage of SCR 35. The specifications (e.g., distances) of the spacings may generally be set based upon on the dimensional and doping specifications of contact regions 30, 32, and 34 as well as semiconductor layer 12 and well region 36. However, an exemplary range for the spaces may be between approximately 0.5 micron and approximately 10 microns. In some embodiments, distances between approximately 1.0 micron and approximately 3.0 microns, or more specifically, around 1.5 microns may be particularly applicable for minimizing the footprint of ESD protection device 6. Longer or shorter distances, however, may be employed, depending on the design specifications of the device.

The distance between contact regions 26 and 32, denoted in FIG. 1 as L1, affects the holding voltage of SCR 35 and, consequently, may be influenced by the width of contact regions 28 and 30 as well as the width of the space therebetween. In addition, the holding voltage is also influenced by placement of contact regions 28 and 30 between the cathode and anode of SCR 35 (i.e., contact regions 26 and 32). In particular, contact region 28 is of opposite conductivity type than contact region 26, has a greater net concentration of dopants of the same conductivity type as semiconductor layer 12 and, is connected to Vss. Consequently, contact region 28 is configured to capture majority carrier charge (i.e., holes in embodiments in which contact region 28 is p-type and electrons when contact region 28 is n-type) from semiconductor layer 12. Likewise, contact region 30 is of opposite conductivity type than contact region 32, has a greater net concentration of dopants of the same conductivity type as well region 36 and, is connected to node 18. As such, contact region 30 is configured to capture majority carrier charge (i.e., electrons in embodiments in which contact region 30 is n-type and holes when contact region 30 is p-type) from contact region 36. Since contact regions 28 and 30 are configured to collect charge generated from SCR 35, such regions may alternatively be referred to herein as "collection regions."

Although not shown in the figures, the ESD protection devices described herein may include one or more additional contact regions which are distinct from SCR 35 and interposed between the cathodic and anodic regions of SCR 35. Such one or more additional contact regions may be of either conductivity type and may generally be disposed along any portion of semiconductor layer 12 between the cathodic and anodic regions of SCR 35. In some embodiments, it may be advantageous to place contact regions of the same conductivity type in proximity to each other such that hole and electron collection may be focused in particular areas between the cathodic and anodic regions of SCR 35 and, theoretically optimize the efficiency of the charge collection.

A consequence of the placement of contact regions 28 and 30 between the cathodic and anodic regions of SCR 35 (i.e., contact regions 26 and 32) is that the voltage required to maintain SCR 35 in an "ON" state is higher than if contact regions were not disposed between the cathode and anode of SCR 35 (i.e., contact regions 26 and 32). In some embodiments, ESD protection device 6 may be configured such that the holding voltage of SCR 35 is higher than the operating voltage of the circuit to which ESD protection device 6 is coupled. In particular, the dimensional, doping, and spacing specifications of well region 36 and contact regions 26, 28, 30, and 32 may be configured such that the holding voltage of SCR 35 is higher than the operating voltage of the circuit to which ESD protection device 6 is coupled. As a result, SCR 35 may be advantageously prevented from being held in the "on" state during normal operation of a circuit and cause catastrophic damage to the circuit.

It is noted that the benefit of having a higher holding voltage may be realized without substantially increasing the trigger voltage of SCR 35 since the holding voltage may be independent set from the trigger voltage. As a consequence, a substantially efficient ESD protection device may be produced. In particular, the ESD protection devices described herein may desirably include an SCR having a substantially higher holding voltage than SCR having substantially similar dimensions and doping levels in which contact regions of opposing conductivity type are not disposed between the anodic and cathodic regions of the SCR. In addition, the ESD protection devices described herein may include substantially similar or lower trigger voltages relative to such conventional ESD protection devices.

In general, the ESD devices described herein may be configured to divert charge of integrated circuits operating at any voltage. During the development of the ESD devices and circuits described herein it was found that the devices may be configured for integrated circuits operating at a maximum voltage of 1.8 volts, 3.3 volts, and 5.0 volts and, specifically, may be configured to have SCRs with holding voltages greater than such maximum operating voltages. It is believed that the devices and circuits described herein may be further configured for integrated circuits operating at other maximum voltages, including those less than 1.8 volts, between 1.8 volts and 5.0 volts, and greater than 5.0 volts. In addition to incorporating the ESD devices described herein in circuits of various voltage operating levels, the ESD devices described herein may be incorporated into a variety of circuits, including memory and logic circuits and particularly CMOS circuits.

Figure 2:
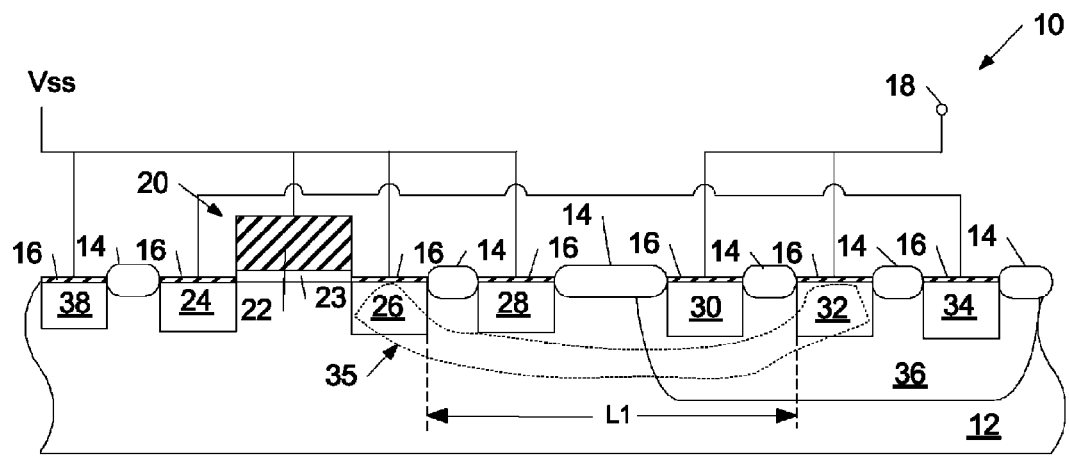
FIG. 2 is an exemplary cross-sectional view of a semiconductor topography configured to provide electrostatic discharge (ESD) protection by at least partial means of a transistor.
Figure 3:
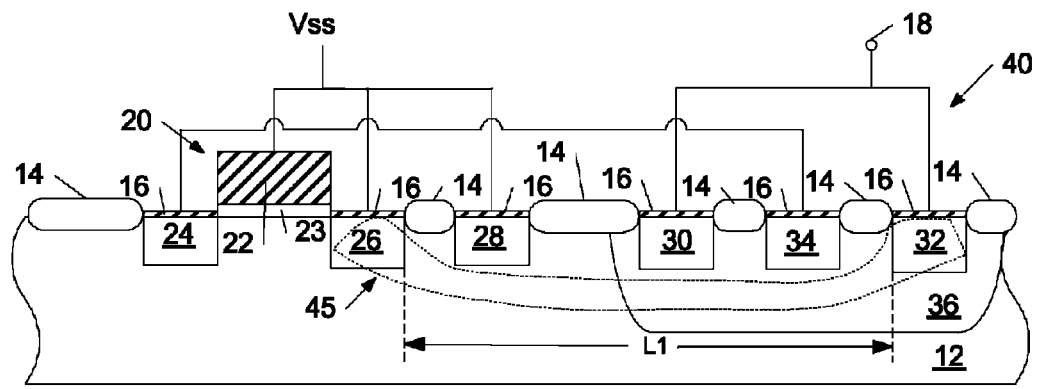
FIG. 3 is an exemplary cross-sectional view of an alternative semiconductor topography configured to provide ESD protection by at least partial means of a transistor.
Figure 4:
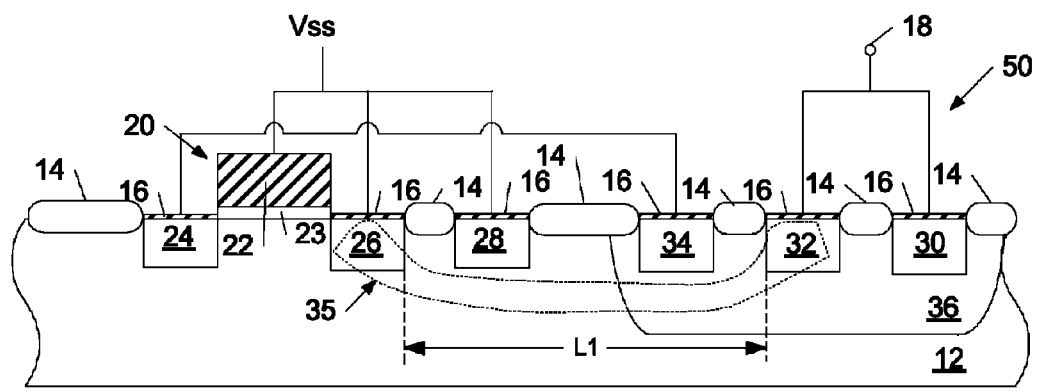
FIG. 4 is an exemplary cross-sectional view of another alternative semiconductor topography configured to provide ESD protection by at least partial means of a transistor.

Exemplary configurations of ESD protection devices that are adapted to divert charge from a bus coupled to the ESD protection devices are shown in FIGS. 2-4. The configuration of operation of elements shown in FIGS. 2-4 having the same reference numerals as those used in FIG. 1 are generally similar and, as such, their description above is referenced and not reiterated for the sake of brevity. FIG. 2 illustrates ESD protection device 10 including transistor 20 and plurality of contact regions and interconnects which are collectively configured and arranged to form SCR 35 and a mechanism by which to trigger the SCR. As set forth in more detail below, ESD protection device 10 may be configured to trigger SCR 35 upon avalanche breakdown drain contact region 24 of transistor 20. It is noted, however, that the ESD protection devices contemplated herein are not necessarily restricted to such a trigger mechanism. In particular, ESD protection device 10 may alternatively be configured with other types of trigger mechanisms known in the art.

As shown in FIG. 2, transistor 20 includes gate 22 and gate oxide 23 disposed above semiconductor layer 12. The materials and dimensional characteristics of gate 22 and gate oxide 23 may include any of those known in the semiconductor fabrication industry. Transistor 20 further includes drain contact region 24 and source contact region 26 disposed within semiconductor layer 12 on opposing sides of gate 22. As used herein, the terms "drain contact region" and "source contact region" may generally refer to the diffusion regions within the semiconductor substrate at which contact is made to allow current flow to and from the transistor. In some embodiments, cladding layer 16 may be formed over such regions, as well as over other contact regions of ESD protection device 10, to improve the electrical conductivity of connections thereto.

In some cases, drain contact region 24 and source contact region 26 may each include a net concentration of electrically active dopants opposite in conductivity type to semiconductor layer 12. In other embodiments, drain contact region 24 and source contact region 26 may be of the same conductivity type as semiconductor layer 12, but may be disposed within a well region of opposite conductivity type. In such cases, the well region may encompass contact region 28 as well as drain contact region 24 and source contact region 26. In any embodiment, exemplary doping levels for drain contact region 24 and source contact region 26 may generally be between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^{-3}$, and in some embodiments around $1.0 \times 10^{20}$ cm$^{-3}$. Higher or lower doping levels, however, may be used, depending on the design specifications of ESD protection device 10.

In some cases, drain contact region 24 may be disposed within a lightly-doped well region of the same conductivity type as the drain contact region, specifically with a doping concentration less than the drain contact region. The increased drain-to-substrate junction area provided by such a lightly-doped well region may increase the junction breakdown voltage, permitting higher voltage operation of the transistor. In some embodiments, such a configuration may be advantageous for circuits which operate with applications of high voltages. In other embodiments, however, the ESD protection devices described herein may be specifically configured for circuits which operate at relatively lower voltages (e.g., 5 volts or less) and, the thus, incorporating drain contact region 26 with its own well region may not be applicable. In any case, it is generally advantageous to configure the breakdown of transistor 20 at a lower voltage than a breakdown voltage of the active devices ESD protection device 10 is configured to protect such that damage to the active devices due to ESD events may be prevented.

Different configurations of transistors may also be considered for the ESD protection devices contemplated herein. For example, a transistor of any triggering mechanism may be configured with a drain contact region that is laterally displaced apart from the gate of the transistor at a greater distance than the source contact region is relative to an opposing side of gate. Such transistors are often referred to as drain extended MOS (DEMOS) transistors or laterally diffused MOS (LDMOS) transistors. In general, a DEMOS transistor may have a relatively high junction breakdown voltage, permitting high voltage operation of the transistor, which may be advantageous for circuits which operate with applications of high voltages (e.g., $V_{DD}$>12 volts). As noted above, however, the ESD protection devices described herein may be specifically configured for circuits which operate at relatively lower voltages (e.g., 5 volts or less) and, the thus, the incorporation of a DEMOS transistor may not be applicable. In some embodiments, the configurations affecting the breakdown of drain contact regions 24 may be tuned and, in some cases, optimized for the operation of ESD device 10, specifically set independent of the holding voltage of SCR 35.

In any case, it is further noted that a transistor of any triggering mechanism used in the ESD protection devices described herein may include sidewall spacers and/or lightly doped shallow regions extending from gate sidewalls. For instance, transistor 20 may, in some embodiments, include sidewall spacers and/or lightly doped shallow regions extending from the sidewalls of gate 22 with respect to either or both of drain and source contact regions 24 and 26. Due to the specific reference of contact being made to regions 24 and 26, the terms "drain contact region" and "source contact region" do not generally include lighter doped shallow regions in such embodiments. Rather, lighter doped shallow regions are generally protected from contact by overlying spacer structures aligned with the sidewalls of the gate.

In general, ESD protection device 10 may be operated in the same manner described above in reference to ESD protection device 6. In particular, when the voltage on the bus coupled to node 18 reaches the breakdown voltage of drain contact region 24, current begins to flow through well region 36 between contact regions 30 and 34 and injects charge from contact region 32 (i.e., holes in embodiments in which contact regions 30 and 34 are n-type and electrons when contact regions 30 and 34 are p-type) into semiconductor layer 12. The charge injection into semiconductor layer 12 forward biases the contact region 26, which in turn injects charges of opposite conductivity type (i.e., electrons in embodiments in which contact region 26 is n-type and holes when contact region 26 is p-type) into well region 36. The injection of the charge from contact region 32 hastens the transition of SCR 35 into a latched state, referenced as a low-impedance "ON" state of SCR 35.

As with ESD protection device 6, contact regions 28 and 30 in ESD protection device 10 are configured to capture charge generated from contact regions 32 and 26, respectively and effectively increase the holding voltage of SCR 35. In some embodiments, the charge injected into semiconductor layer 12 from SCR 35 may be further collected at contact region 38 (in addition to collecting charge at contact region 28). In order to collect charge, contact region 38 includes the same conductivity type as semiconductor layer 12 but at a higher concentration and is coupled to Vss. In some cases, contact region 38 may include a doping level within the range noted above for contact region 28. Contact regions 28 and 38, however, may include relatively similar or different dopant concentration levels. As with contact region 28, since contact region 38 is configured to collect charge generated from SCR 35, the region may alternatively be referred to herein as a "collection region."

Alternative configurations of ESD protection devices that are adapted to divert charge from a bus coupled to the ESD protection devices are shown in FIGS. 3 and 4. In particular, FIG. 3 illustrates ESD protection device 40 having the same components as ESD protection device 10 in FIG. 2 but slightly rearranged. In particular, collection region 38 has been omitted and the placement of contact regions 32 and 34 has been switched relative to ESD protection device 10 of FIG. 2. It is noted that the omission of collection region 38 and the rearrangement of contact regions 32 and 34 are not mutually exclusive and, thus, may be incorporated into an ESD protection device independent of each other. The rearrangement (switching) of contact regions 32 and 34 relative to FIG. 2 may increase the holding voltage of SCR 35 by increasing the amount of charge collection between the anodic and cathodic regions of the SCR (i.e., charge will be collected by both charge regions 30 and 34) and increasing the distance between the anodic and cathodic regions of the SCR (as denoted by L1 in FIG. 3). It is noted that a variation of ESD protection device 40 may also be considered in which the arrangement of contact regions 30 and 34 are switched relative to their depiction in FIG. 3. Such a configuration is believed to have a substantially similar holding voltage as ESD protection device 40 depicted in FIG. 3.

Another alternative configuration of an ESD protection device that is adapted to divert charge from a bus coupled to the ESD protection device is shown in FIG. 4. In particular, FIG. 4 illustrates ESD protection device 50 having the same components as ESD protection device 10 in FIG. 2 but slightly rearranged. In particular, collection region 38 has been omitted and the placement of contact regions 30 and 34 has been switched relative to ESD protection device 10 of FIG. 2. It is noted that the omission of collection region 38 and the rearrangement of contact regions 30 and 34 are not mutually exclusive and, thus, may be incorporated into an ESD protection device independent of each other. The rearrangement (switching) of contact regions 30 and 34 may generally decrease the holding voltage of SCR 35 since charge collection by contact region 34 is not expected to be as efficient as charge collection by contact region 30 in FIG. 2. Such a configuration may be advantageous in some cases, particularly for tuning the holding voltage of SCR 35 to a particular level.

It will be appreciated to those skilled in the art having the benefit of this disclosure that this invention is believed to provide electrostatic discharge (ESD) protection devices and circuits having a pair of charge collection regions interposed between cathodic and anodic regions of a silicon controlled rectifier (SCR) and which are further independent of the SCR. Further modifications and alternative embodiments of various aspects of the invention will be apparent to those skilled in the art in view of this description. For example, although the devices are specifically discussed in reference to protection from ESD events, the devices may additionally or alternatively be used to protect against other excessive voltage events. It is intended that the following claims be interpreted to embrace all such modifications and changes and, accordingly, the drawings and the specification are to be regarded in an illustrative rather than a restrictive sense.

What is claimed is:

1. A device for providing electrostatic discharge (ESD) protection, comprising:
 a silicon controlled rectifier (SCR);
 a transistor implementing a mechanism for triggering the SCR;
 a pair of contact regions of opposing conductivity type distinct from the SCR and interposed between a cathodic region and an anodic region of the SCR, wherein the contact regions of opposing conductivity type are configured to collect charge generated from the SCR;
 an interconnect structure coupling the anodic region of the SCR to a first contact region of the pair of contact regions closest to the anodic region, wherein the first contact region comprises a net concentration of dopants of opposite conductivity as the anodic region, and wherein a second contact region of the pair of contact regions closest to the cathodic region comprises a net concentration of dopants of opposite conductivity as the cathodic region, wherein the anodic region of the SCR and the first contact region are disposed within a well region having the same conductivity type as the first contact region;
 an additional collection region interposed between the cathodic and anodic regions of the SCR and comprising the same conductivity type as the first collection region; and
 interconnect structures coupling the additional collection region to a drain contact region of the transistor.

2. The device of claim 1, wherein the cathodic and anodic regions of the SCR are spaced apart by approximately 1.5 microns or less.

3. The device of claim 1, wherein the second and first contact regions are respectively spaced apart from the cathodic and anodic regions.

4. The device of claim 1, wherein at least one of the second and first contact regions is adjoined to one of the cathodic and anodic regions.

5. The device of claim 1, wherein the mechanism is selected from a group consisting of an avalanche breakdown of a drain region of a metal-oxide semiconductor (MOS) transistor, a resistance-capacitance triggered n-channel MOS field effect transistor, and an active MOS mode transistor.

6. A device for providing electrostatic discharge (ESD) protection, comprising:
 a transistor;
 a silicon controlled rectifier (SCR) comprising a cathodic region dually serving as a source contact region of the transistor;
 a pair of collection regions of opposing conductivity type distinct from the SCR interposed between the cathodic region and an anodic region of the SCR, wherein the pair of collection regions are configured to collect charge generated by the SCR;
 interconnect structures coupling the anodic region of the SCR to a first collection region of the pair of collection regions closest to the anodic region, wherein the anodic region of the SCR and a first collection region of the pair of collection regions closest to the anodic region are disposed within a well region having the same conductivity type as the first collection region; and
 a first additional collection region interposed between the cathodic and anodic regions of the SCR and comprising the same conductivity type as the first collection region; and
 interconnect structures coupling the first additional collection region to a drain contact region of the transistor.

7. The device of claim 6, further comprising interconnect structures coupling the source contact region and a gate of the transistor to a second collection region of the pair of collection regions closest to the cathodic region of the SCR.

8. The device of claim 7, further comprising:
 a second additional collection region arranged adjacent to a drain contact region of the transistor; and
 interconnect structures coupling the second additional collection region to the first collection region.

9. The device of claim 6, wherein the cathodic and anodic regions of the SCR are spaced apart by approximately 1.5 microns or less.

10. A circuit, comprising:
 high and low voltage power supply bus bars; and
 an electrostatic discharge (ESD) protection device coupled between the high and low voltage power supply bus bars, wherein the ESD protection device comprises:
 a silicon controlled rectifier (SCR);
 a transistor implementing a mechanism for triggering the SCR;
 a pair of contact regions of opposing conductivity type distinct from the SCR and interposed between a cathodic region and an anodic region of the SCR, wherein the contact regions of opposing conductivity type are configured to collect charge generated from the SCR;
 an interconnect structure coupling the anodic region of the SCR to a first contact region of the pair of contact regions closest to the anodic region, wherein the first contact region comprises a net concentration of dopants of opposite conductivity as the anodic region, and wherein a second contact region of the pair of contact regions closest to the cathodic region comprises a net concentration of dopants of opposite conductivity as the cathodic region, wherein the anodic region of the SCR and the first contact region are disposed within a well region having the same conductivity type as the first contact region; and
 interconnect structures coupling a drain contact region of the transistor to a first collection region of the pair of collection regions closest to the anodic region of the SCR.

11. The circuit of claim 10, wherein the SCR comprises a holding voltage higher than a maximum operating voltage of the circuit.

12. The circuit of claim 11, wherein the maximum operating voltage of the circuit is greater than or equal to approximately 1.8 volts.

13. The circuit of claim 11, wherein the maximum operating voltage of the circuit is greater than or equal to approximately 5.0 volts.

14. The circuit of claim 10, wherein the cathodic and anodic regions of the SCR are spaced apart by approximately 1.5 microns or less.

* * * * *